US005538941A

United States Patent [19]

Findikoglu et al.

[11] Patent Number: 5,538,941

[45] Date of Patent: Jul. 23, 1996

[54] SUPERCONDUCTOR/INSULATOR METAL OXIDE HETERO STRUCTURE FOR ELECTRIC FIELD TUNABLE MICROWAVE DEVICE

[75] Inventors: Alp T. Findikoglu; Thirumalai Venkatesan, both of College Park, Md.

[73] Assignee: University of Maryland, College Park, Md.

[21] Appl. No.: 202,568

[22] Filed: Feb. 28, 1994

[51] Int. Cl.[6] .......... H01B 12/06; H01L 39/00

[52] U.S. Cl. .......... 505/210; 333/99 S; 505/700; 505/701; 505/866; 250/336.2; 257/662

[58] Field of Search .......... 333/995; 257/38, 257/39, 661–663; 505/210, 204, 190–192, 700, 701, 866; 250/336.2

[56] References Cited

U.S. PATENT DOCUMENTS

| | | | |
|---|---|---|---|
| 4,697,143 | 9/1987 | Lockwood et al. | 324/754 |
| 4,837,536 | 6/1989 | Honjo | 333/247 |
| 4,970,395 | 11/1990 | Kruse, Jr. | 505/701 X |
| 5,219,827 | 6/1993 | Higaki et al. | 505/210 |
| 5,256,636 | 10/1993 | Wellstood et al. | 505/191 X |
| 5,291,035 | 3/1994 | Wellstood et al. | 257/33 |
| 5,329,261 | 7/1994 | Das | 505/703 X |

FOREIGN PATENT DOCUMENTS

| | | | |
|---|---|---|---|
| 0483784 | 5/1992 | European Pat. Off. . | |
| 508893 | 10/1992 | European Pat. Off. | 257/662 |
| 472777 | 3/1992 | Japan . | |

OTHER PUBLICATIONS

Ramesh, R., et al; "Ferroelectric $PbZr_{0.2}Ti_{0.8}O_3$ Thin Films on Epitaxial Y—Ba—CuO" *Applied Phys Lett*; vol. 59, No. 27; 30 Dec. 1991; pp. 3542–3544.

Galt et al., "Characterization of a tunable thin film microwave $YBa_2Cu_3O_{7-x}/SrTiO_3$ coplanar capacitor", Appl. Phys. Lett. 63 (22), 29 Nov. 1993, pp. 3078–3080.

Babbitt et al., "Planar Microwave Electro-optic Phase Shifters," Microwave Journal, Jun. 1992, pp. 63–79.

Varadan et al., "Ceramic Phase Shifters for Electronically Steerable Antenna Systems," Microwave Journal, Jan. 1992, pp. 116–127.

Findikoglu et al., "A noncontact cryogenic microwave measurement system for superconducting device characterization," Rev. Sci. Instrum. 65 (9), Sep. 1994, pp. 2912–2915.

Laskar et al., "An On-Wafer Cryogenic Microwave Probing System for Advanced Transistor and Superconductor Applications," Microwave Journal, Feb. 1993, pp. 108–114.

Findikoglu et al., "Effect of dc electric field on the effective microwave surface impedence of $YBa_2Cu_3O_7/SrTiO_3/YBa_2Cu_3O_7$ trilayers," Appl. Phys. Lett. 63 (23), Dec. 1993, pp. 3215–3217.

Hermann et al., "Oxide Superconductors and Ferroelectrics—Materials for a New Generation of Tunable Microwave Device", Journal of Superconductivity, vol. 7, No. 2, 1994, pp. 463–469.

Lancaster et al., "Superconducting microwave resonators," IEEE Proceedngs-H, vol. 139, No. 2, Apr. 1992, pp. 149–156.

Hermann, A. M. et al., Bulletin of American Phys. Soc., vol. 38, No. 1, p. 689 (1993).

Galt, David et al., Bulletin of American Phys. Soc., vol. 38, No. 1, p. 840 (1993).

Findikoglu, T. et al., Bulletin of American Phys. Soc., vol. 38, No. 1, p. 838 (1993).

*Primary Examiner*—Benny T. Lee
*Attorney, Agent, or Firm*—Foley & Lardner

[57] ABSTRACT

A superconductor/insulator metal oxide hetero structure for electric field tunable microwave device, including a dielectric substrate, a first superconducting electrode of an oxide superconductor provided on said dielectric substrate, an insulating layer formed on the first superconducting electrode and a second electrode arranged on the insulating layer in which the conductivity of the first superconducting electrode and/or the dielectric property of the insulating layer can be changed by a dc bias voltage applied between the first and the second electrodes so that surface resistance and/or surface reactance can be changed.

8 Claims, 1 Drawing Sheet

SUPERCONDUCTOR/INSULATOR METAL OXIDE HETERO STRUCTURE FOR ELECTRIC FIELD TUNABLE MICROWAVE DEVICE

BACKGROUND OF THE INVENTION

1. Field of the invention

The present invention relates to a superconductor/insulator metal oxide hetero structure for an electric field tunable microwave device, and particularly to a structure which realizes, a novel microwave device.

2. Description of related art

Electromagnetic waves called "microwaves" or "millimetric waves" having wavelengths range from tens of centimeters to millimeters can be theoretically said to be merely a part of an electromagnetic wave spectrum, but in many cases, have been considered from an engineering viewpoint to be a special independent field of the electromagnetic wave spectrum, since special and unique methods and devices have been developed for handling these electromagnetic waves.

Microwave properties of any material can be conveniently expressed in terms of a complex parameter, surface impedance that describes the interaction between the material and any electromagnetic radiation incident upon it. The real and imaginary components of the surface impedance are called surface resistance and surface reactance, respectively. Surface resistance is the quantity that is proportional to the microwave energy dissipation induced in the material whereas surface reactance is related to the microwave energy stored in the material.

For most passive microwave devices, it is desirable to have low energy dissipation, i.e. low surface resistance, so that microwave signals can be sent efficiently and to longer distances. Also, for the transmission of microwave signals in most applications with multifrequency components, it is desirable to have a transmission medium with negligible or no dispersion; in other words frequency independent energy storage, i.e. surface reactance in the system.

In general, superconductors are theoretically expected and experimentally shown to have lower surface resistance and nearly frequency independent surface reactance, i.e. much lower dispersion than normal conductors at microwave frequencies and certain cryogenic temperatures. This makes superconductors attractive for most passive microwave device applications.

In addition, the oxide superconductor material (high $T_c$ copper oxide superconductor) which has been recently discovered in study makes it possible to realize the superconducting state by low cost liquid nitrogen cooling. Therefore, various microwave components using an oxide superconductor have been proposed.

For active microwave device applications, in addition to the above mentioned requirements, it is necessary to modulate the surface impedance of the device by an independent external bias. Among various methods to modulate the microwave response of a circuit, electric field induced modulation has clear advantages such as low energy consumption input-output current isolation and high input resistance.

A. M. Hermann et al. showed in Bulletin of Am. Phys. Soc. Vol. 38, No. 1, pp. 689 (1993), a tunable microwave resonator comprising two superconducting electrodes of Tl—Ba—Ca—Cu—O thin films and an insulating layer of $Ba_{o.1}Sr_{0.9}TiO_3$ between the superconducting electrodes. In this microwave resonator, the resonant frequency is controlled by a dc bias voltage applied to the resonator. In the resonator, the dc bias voltage changes the dielectric constant of $Ba_{o.1}Sr_{0.9}TiO_3$ so that a 1.5% shift in resonant frequency can be obtained. However, the shift in resonant frequency is only to the changes in the properties of the dielectric medium.

David Galt et al. also showed a tunable microwave resonator of a different structure in Bulletin of Am. Phys. Soc. Vol. 38, No. 1, pp. 840 (1993)

In Bulletin of Am. Phys. Soc. Vol. 38, No. 1, pp. 838 (1993), Alp T. Findikoglu et al. showed that both the resonant frequency and the quality factor of a resonator can be controlled by a dc bias applied between two superconducting layer across a dielectric layer, all forming part of the resonator. It is shown here that the microwave response is modulated through changes in both the superconducting properties of $Y_1Ba_2Cu_3O_{7-\delta}$ oxide superconductor (where $0 \leqq \delta \leqq 0.5$) and dielectric properties of $SrTiO_3$.

SUMMARY OF THE INVENTION

Accordingly, it is an object of the present invention to provide a superconductor/insulator metal oxide hetero structure for electric field tunable microwave devices which combine the advantages of superconducting medium with the versatility of an electric field tunable active response.

Another object of the present invention is to provide a novel microwave resonator which has dc electric field tunable quality factor and resonant frequency.

The above and other objects of the present invention are achieved in accordance with the present invention by a superconductor/insulator metal oxide hetero structure for electric field tunable microwave device, including a dielectric substrate, a first superconducting electrode of an oxide superconductor provided on said dielectric substrate, an insulating layer formed on the first superconducting electrode and a second electrode arranged on the insulating layer in which the conductivity of the first superconducting electrode and/or the dielectric property of the insulating layer can be changed by a dc bias voltage applied between the first and the second electrodes so that surface reactance and/or surface resistance can be changed. If suitable patterning is applied to this basic device structure, the trilayer can be used as various microwave components including an inductor, a capacitor, a transmission line, a delay line, a resonator, a transistor. etc.

Since the oxide superconductor has low carrier density, its conductivity can be easily varied by applying an electric field, which is one of its distinctive properties.

The superconducting signal conductor layer and the superconducting ground conductor layer of the microwave component in accordance with the present invention can be formed of thin films of general oxide superconductor materials such as a high critical temperature (high-Tc) copper-oxide type oxide superconductor material typified by a Y—Ba—Cu—O type compound oxide superconductor material, a Bi—Sr—Ca—Cu—O type compound oxide superconductor material, a Tl—Ba—Ca—Cu—O type compound oxide superconductor material, a Hg—Ba—Sr—Ca—Cu—O type compound oxide superconductor material, a Nd—Ce—Cu—O type compound oxide superconductor material. In addition, deposition of the oxide superconductor thin film can be exemplified by a sputtering process, a laser ablation process, a co-evaporation process, etc.

The substrate can be formed of a material selected from the group consisting of MgO, $SrTiO_3$, $NdGaO_3$, $Y_2O_3$, $LaAlO_3$, $LaGaO_3$, $Al_2O_3$, $ZrO_2$, Si, GaAs, sapphire and fluorides. However, the material for the substrate is not limited to these materials, and the substrate can be formed of any oxide material which does not diffuse into the high-Tc copper-oxide type oxide superconductor material used, and which substantially matches in crystal lattice with the high-Tc copper-oxide type oxide superconductor material used, so that a clear boundary is formed between the oxide insulator thin film and the superconducting layer of the high-Tc copper-oxide type oxide superconductor material. From this viewpoint, it can be said to be possible to use an oxide insulating material conventionally used for forming a substrate on which a high-Tc copper-oxide type oxide superconductor material is deposited.

A preferred substrate material includes a MgO single crystal, a $SrTiO_3$ single crystal, a $NdGaO_3$ single crystal substrate, a $Y_2O_3$, single crystal substrate, a $LaAlO_3$ single crystal, a $LaGaO_3$ single crystal, a $Al_2O_3$ single crystal and a $ZrO_2$ single crystal.

For example, the oxide superconductor thin film can be deposited by using, for example, a (100) surface of a MgO single crystal substrate, a (110) surface or (100) surface of a $SrTiO_3$ single crystal substrate and a (001 ) surface of a $NdGaO_3$ single crystal substrate, as a deposition surface on which the oxide superconductor thin film is deposited.

Several materials are suitable for the insulating layer, such as $SrTiO_3$, MgO, $BaTiO_3$, $NdGaO_3$, $CeO_2$. Generally, any material which is insulating is acceptable. However, for devices where the modulation is dominated by the changes in the dielectric properties of the insulating layer, it is more desirable to use more ionic dielectrics, piezoelectrics and ferroelectrics such as lead zirconium titanate (PLZT) or lead barium strontium titanate ($(Pb, Ba, Sr)TiO_3$).

The above and other objects, features and advantages of the present invention will be apparent from the following description of preferred embodiments of the invention with reference to the accompanying drawings However, the examples explained hereinafter are only for illustration of the present invention, and therefore, it should be understood that the present invention is in no way limited to the following examples.

DESCRIPTION OF THE PREFERRED EMBODIMENTS

Figure 1A:
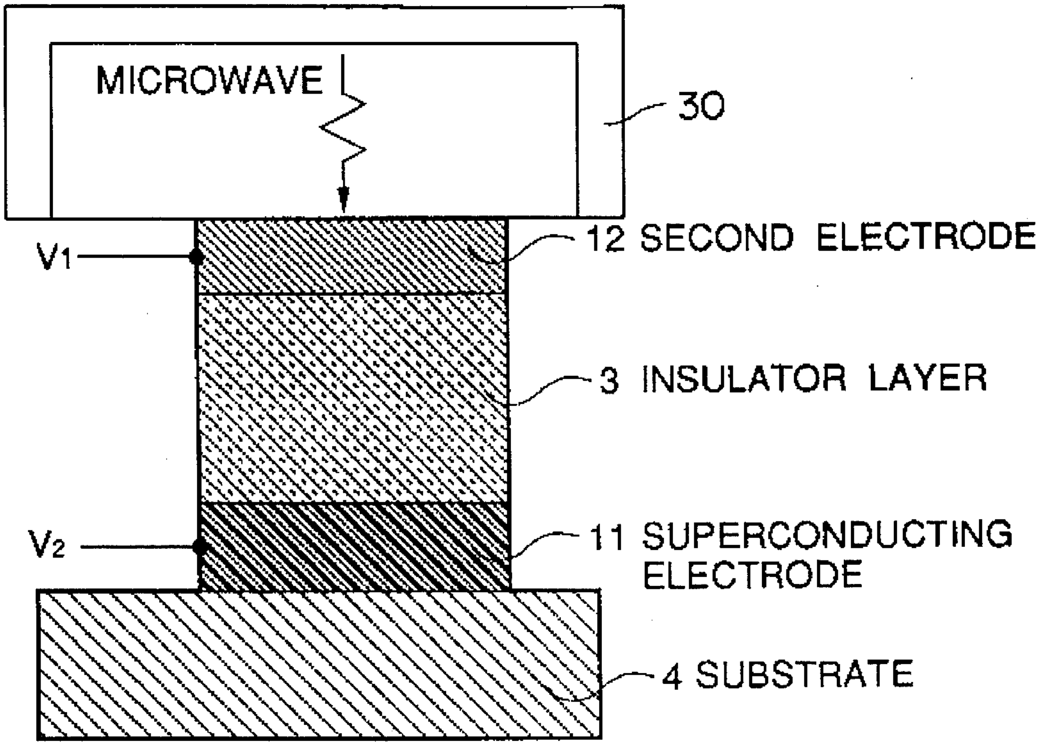
FIG. 1A is a diagrammatic sectional view showing a first embodiment of a basic structure for a superconducting active device in accordance with the present invention.
Figure 1B:
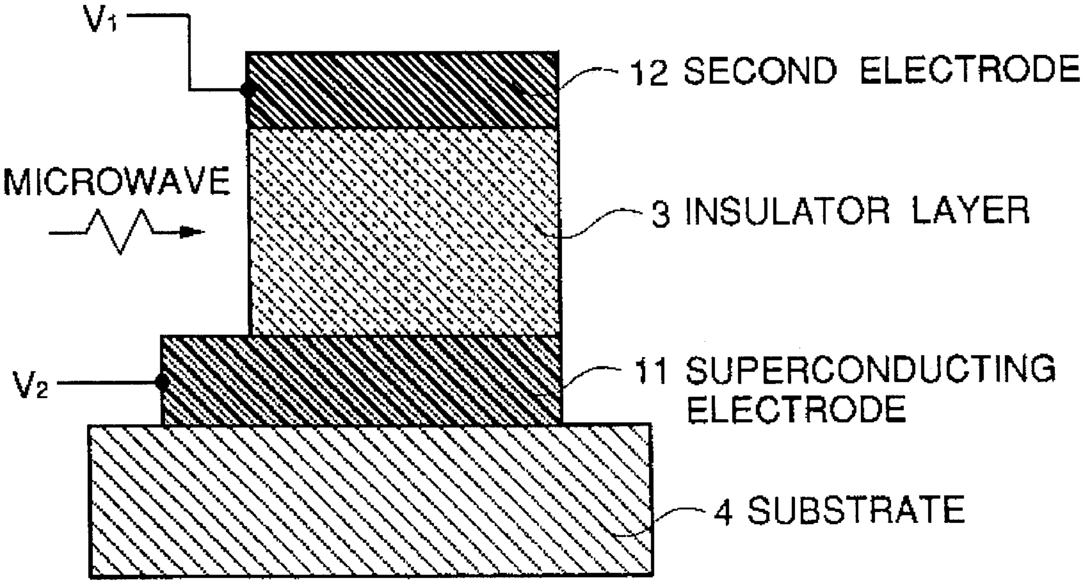
FIG. 1B is a diagrammatic sectional view showing a second embodiment of a basic structure for a superconducting active device in accordance with the present invention.

Referring to FIG. 1A and 1B, there are shown diagrammatic sectional views showing embodiments of the microwave device structure in accordance with the present invention.

The shown microwave device structure comprises a substrate 4 formed of $LaAlO_3$, a first superconducting electrode 11 of a $Y_1Ba_2Cu_3O_{7-\delta}$ oxide superconductor, (where $0 \leqq \delta \leqq 0.5$) an insulating layer 3 of $SrTiO_3$ and a second superconducting electrode 12' or 12 of a $Y_1Ba_2Cu_3O_{7-\delta}$ oxide superconductor stacked in the named order, as shown in either FIG. 1A or FIG. 1B, respectively.

The first superconducting electrode 11 has a thickness on the order of 40 nanometers and a dimension of 1.5 cm×1.5 cm which are suitable for obtaining high quality superconducting film with a transition temperature higher than 85 K. The thickness is determined by independent deposition calibration.

The insulating layer 3 has a thickness of 800 nanometers and a dimension of 1.5 cm×1.5 cm which are determined by independent thickness calibration for the pulsed laser deposition.

The second electrodes 12 and 12' can be a thick superconducting layer such as 80 nanometers thick $Y_1Ba_2Cu_3O_{7-\delta}$ if the response is to be dominated by the changes in the second electrodes 12 and 12'.

The second electrodes 12 and 12' can be a very thin high carrier density normal conducting layer such as an Au layer thinner than 10 nanometers if the response is to be dominated by the insulating layer 3 and the first superconducting electrode 11.

The second electrodes 12 and 12' can be a thin superconducting layer with low carrier density and opposite polarity of the charge carriers such as on the order of 10 nanometers thick electron carrier type Nd—Ce—Cu—O if the response is to be influenced by all three changes in the three layers in a comparable fashion ($Y_1Ba_2Cu_3O_{7-\delta}$ is a hole-carrier type superconductor).

In this connection, if a larger shift in dielectric property is required, a ferroelectric material such as Sr—Ba—Ti—O is preferably used for the insulator layer 3, since the dielectric property of $Sr_xBa_{1-x}TiO_3$ is more significantly influenced by an electric field.

In addition, conducting wires such as gold wires (not shown) with appropriate microwave filters are provided on the first and second superconducting electrodes 11 and 12 in order to apply respective dc bias voltages $V_1$ and $V_2$.

Microwaves are launched into the insulating layer 3 from a remote antenna or along a lead conductor (not shown) foraged on the substrate 4 connecting to the first superconducting electrode 11 in the direction perpendicular to the substrate 4. The superconductor/insulator metal oxide hetero structure may be provided in a microwave resonator 30 as illustrated in FIG. 1A.

FIG. 1B shows a sectional view of a second embodiment of the microwave device structure. The microwave device structure has the same structure as that of FIG. 1A with like reference indicators denoting like components.

In this microwave device, differently to the microwave device structure shown in FIG. 1A, microwaves are launched into the insulating layer 3 through the second superconducting electrode 12 in the direction parallel to the substrate 4 along a lead conductor (not shown).

These basic microwave device structures shown in FIGS. 1A and 1B were manufactured by a following process.

The substrate 4 was formed of a square $LaAlO_3$ having each side of 15 mm and a thickness of 0.5 mm. The first superconducting signal electrode 11 was formed of a c-axis orientated $Y_1Ba_2Cu_3O_{7-\delta}$ oxide superconductor thin film having a thickness of 40 nanometers. This $Y_1Ba_2Cu_3O_{7-\delta}$ compound oxide superconductor thin film was deposited by pulsed laser ablation. The deposition condition was as follows:

Target pellet: $Y_1Ba_2Cu_3O_x$ (where $6 \leqq x \leqq 7$)

Gas: 100 mTorr of flowing $O_2$

Pressure: 100 mTorr

Substrate Temperature: 780° C.

Film thickness: 40 nanometers

Then, $SrTiO_3$ layer was deposited on the oxide superconductor thin film by pulsed laser ablation and then either a c-axis orientated $Y_1Ba_2Cu_3O_{7-\delta}$ oxide superconductor thin film was stacked on the $SrTiO_3$ layer by pulsed laser ablation, or a very thin film of Au (thinner than 20 nanometers) was thermally evaporated so that the basic superconducting microwave device structure was completed.

For the superconducting microwave device structure with $Y_1Ba_2Cu_3O_{7-\delta}/SrTiO_3/Y_1Ba_2Cu_3O_{7-\delta}$ thus formed, a dc electric field modulation effect on the surface resistance and reactance was measured by use of a dielectric resonator technique. In this technique, a sapphire puck is placed on the surface of a trilayer which forms an end wall of a cylindrical copper cavity: For the $TEM_{018}$ mode of the dielectric resonator, the microwave response is dominated by the trilayer sample. The measured quality factor is inversely proportional to the surface resistance and the changes in the resonant frequency are inversely proportional to the changes in the surface reactance. Thus, the modulation of surface resistance and surface reactance can be determined from the measurement of the quality factor and resonant frequency.

By locating the microwave resonator in accordance with the present invention in a cryostat, resonant frequency was measured at temperatures of 25 K., while varying dc bias voltages was applied between the first and second superconducting electrodes. The result of the measurement showed two distinct regions:

(a) dielectric-change dominant region where changes in the dielectric properties of the insulating layer dominate the response.

(b) top superconductor-change dominant region where changes in the conductivity of the top superconducting layer dominate the response.

For region (a), we obtained

Surface resistance change: 1 $\mu\Omega/V_{dc}$

Surface reactance change: 7 $\mu\Omega/V_{dc}$ where surface resistance and reactance change in opposite directions.

For region (b), we obtained

Surface resistance change: 0.25 $\mu\Omega/V_{dc}$

Surface reactance change: 1.8 $\mu\Omega/V_{dc}$ where surface resistance and reactance change in the same direction.

As mentioned above, the microwave resonator in accordance with the present invention is so constructed that the resonant frequency and quality factor can be changed by a dc bias voltage.

Accordingly, the microwave resonator in accordance with the present invention can be effectively used as an active element in a local oscillator of microwave communication instruments, and the like.

The invention has thus been shown and described with reference to the specific embodiments. However, it should be noted that the present invention is in no way limited to the details of the illustrated structures but changes and modifications may be made within the scope of the appended claims.

We claim:

1. A superconductor/insulator metal oxide hetero structure for electric field tunable microwave device, comprising:

a dielectric substrate;

a first superconducting electrode of an oxide superconductor provided on said dielectric substrate;

an insulating layer disposed on the first superconducting electrode; and a second electrode arranged on the insulating layer, said first superconducting electrode, said insulating layer and said second electrode defining a multilayer structure, wherein at least one of a conductivity of the first superconducting electrode and a permittivity of the insulating layer is changed by a dc bias voltage applied between the first and the second electrodes so that at least one of an overall effective microwave surface resistance and an effective microwave surface reactance of the multilayer structure is changed to effect a tuning at microwave frequencies of said hetero structure.

2. A superconductor/insulator metal oxide hetero structure as claimed in claim 1, wherein the second electrode is a superconducting electrode of a same oxide superconductor as the first superconducting electrode.

3. A superconductor/insulator metal oxide hetero structure as claimed in claim 1, wherein the second electrode is a superconducting electrode of an oxide superconductor having an opposite charge carrier type with respect to the first superconducting electrode and a conductivity of the second superconducting electrode is also changed by the applied dc bias voltage.

4. A superconductor/insulator metal oxide hetero structure claimed in claim 1, wherein said dielectric substrate comprises a material selected from the group consisting of MgO, $SrTiO_3$, $NdGaO_3$, $Y_2O_3$, $LaAlO_3$, $LaGaO_3$, $Al_2O_3$, $ZrO_2$, Si, GaAs, and sapphire.

5. A microwave device as claimed in claim 1, wherein the oxide superconductor is a high critical temperature copper-oxide superconductor material.

6. A microwave device claimed in claim 5 wherein the oxide superconductor is a material selected from the group consisting of a Y—Ba—Cu—O type compound oxide superconductor material, a Bi—Sr—Ca—Cu—O type compound oxide superconductor material, a Tl—Ba—Ca—Cu—O type compound oxide superconductor material, a Hg—Ba—Sr—Ca—Cu—O type compound oxide superconductor material and a Nd—Ce—Cu—O type compound oxide superconductor material.

7. A microwave device as claimed in claim 1, wherein the microwave is applied to and launched into the insulating layer from an upper surface of the multilayer structure through the second electrode.

8. A microwave device as claimed in claim 1, wherein the microwave is applied to and launched into the insulating layer from a side surface of the multilayer structure.

* * * * *